(12) United States Patent
Sakai et al.

(10) Patent No.: US 8,461,756 B2
(45) Date of Patent: Jun. 11, 2013

(54) LINEAR WHITE LIGHT SOURCE, AND BACKLIGHT AND LIQUID CRYSTAL DISPLAY DEVICE USING THE SAME

(75) Inventors: Ryo Sakai, Yokohama (JP); Yasuhiro Shirakawa, Yokohama (JP); Hajime Takeuchi, Yokohama (JP); Tsutomu Ishii, Yokohama (JP); Yasumasa Ooya, Chigasaki (JP)

(73) Assignees: Kabushiki Kaisha Toshiba, Tokyo (JP); Toshiba Materials Co., Ltd., Yokohama-shi (JP)

( * ) Notice: Subject to any disclaimer, the term of this patent is extended or adjusted under 35 U.S.C. 154(b) by 0 days.

(21) Appl. No.: 12/950,851

(22) Filed: Nov. 19, 2010

(65) Prior Publication Data

US 2011/0116005 A1 May 19, 2011

Related U.S. Application Data

(63) Continuation of application No. PCT/JP2009/002136, filed on May 15, 2009.

(30) Foreign Application Priority Data

May 19, 2008 (JP) ................................ P2008-130949

(51) Int. Cl.
*H01L 33/00* (2010.01)
*F21V 13/00* (2006.01)
*C09K 11/00* (2006.01)

(52) U.S. Cl.
USPC .......... 313/502; 313/501; 313/503; 362/97.3; 362/97.2

(58) Field of Classification Search
USPC ................. 313/501–503, 512; 362/800, 97.2, 362/97.3
See application file for complete search history.

(56) References Cited

U.S. PATENT DOCUMENTS

| 7,023,019 B2 * | 4/2006 | Maeda et al. ................... 257/89 |
| 2004/0104391 A1 | 6/2004 | Maeda et al. |
| 2005/0212397 A1 | 9/2005 | Murazaki et al. |
| 2007/0085093 A1 * | 4/2007 | Ohmae et al. ................... 257/89 |
| 2007/0165186 A1 * | 7/2007 | Copner et al. .................. 353/30 |
| 2007/0246734 A1 * | 10/2007 | Lee et al. ....................... 257/103 |
| 2008/0067918 A1 * | 3/2008 | Iwasaki et al. ................ 313/503 |

FOREIGN PATENT DOCUMENTS

| CN | 1633718 | 6/2005 |
| EP | 1367655 | 3/2003 |
| JP | 2000-258749 | 9/2000 |
| JP | 2005-330459 | 12/2005 |
| JP | 2005-353507 | 12/2005 |

(Continued)

OTHER PUBLICATIONS

International Preliminary Report on Patentability issued Jan. 20, 2011 in International Application No. PCT/JP2009/002136 (English Translation).

*Primary Examiner* — Karabi Guharay
(74) *Attorney, Agent, or Firm* — Oblon, Spivak, McClelland, Maier & Neustadt, L.L.P.

(57) ABSTRACT

A linear white light source 1 includes a base, a plurality of light emitting diode chips linearly disposed on the base and each generating ultraviolet light having a wavelength of not less than 330 nm nor more than 410 nm, and a phosphor layer continuously formed on the base to cover the plurality of light emitting diode chips and containing a red light emitting phosphor, a green light emitting phosphor, and a blue light emitting phosphor.

15 Claims, 5 Drawing Sheets

FOREIGN PATENT DOCUMENTS

| | | |
|---|---|---|
| JP | 2007-305672 | 11/2007 |
| JP | 2007305672 A * | 11/2007 |
| JP | 2007-329511 | 12/2007 |
| JP | 2008-74890 | 4/2008 |
| KR | 10-2008-0087049 | 9/2008 |
| TW | 595012 | 6/2004 |
| WO | WO 03/021691 | 3/2003 |
| WO | WO 2008/096545 | 8/2008 |

* cited by examiner

LINEAR WHITE LIGHT SOURCE, AND BACKLIGHT AND LIQUID CRYSTAL DISPLAY DEVICE USING THE SAME

CROSS-REFERENCE TO RELATED APPLICATION

This application is continuation of prior International Application No. PCT/JP2009/002136, filed on May 15, 2009 which is based upon and claims the benefit of priority from Japanese Patent Application No. 2008-130949, filed on May 19, 2008; the entire contents of all of which are incorporated herein by reference.

FIELD

Embodiments described herein relate generally to a linear white light source, and a backlight and a liquid crystal display device using the same.

BACKGROUND

Conventionally, a cold cathode fluorescent lamp (CCFL: Cold Cathode Fluorescent Lamp) has been used as a light source for a backlight in a liquid crystal display device or the like. However, in the case when the cold cathode fluorescent lamp is used as a light source for a backlight, there exist problems such that color reproducibility is low, and further an environmental burden is large because mercury is used.

On the other hand, in recent years, a blue light emitting diode chip and a light emitting diode chip that is capable of emitting ultraviolet light have been developed commercialized, and LED illumination has been actively developed. For the LED illumination, there exist three methods, which are a method in which a B-light emitting diode chip and a yellow light emitting phosphor are combined, a method in which lights of an R-light emitting diode chip, a G-light emitting diode chip, and a B-light emitting diode chip are mixed, and a method in which an UV-light emitting diode chip emitting ultraviolet light and RGB phosphors are combined. The former two methods each have problems with regard to points of color reproducibility, and color controllability color mixture, and thus the method of an UV-light emitting diode chip+RGB phosphors has been increasingly expected.

A light source using a light emitting diode chip has long life and high reliability, and an exchange work and the like become easier to be performed, so that it has been expected to be used as a component part of various display devices. A color tone of light emitted from the light source depends not only on a light emission wavelength of the light emitting diode chip, and lights in a visible light spectrum from blue to red depending on intended uses can be obtained according to types of phosphors to be contained in a phosphor layer to be formed on a front surface or the like of the light emitting diode chip. Particularly, a white-light-emitting-type light source has been expected to be used as a light source for a backlight of a liquid crystal display device in a portable communication device, a liquid crystal display device in a PC, and the like.

The backlight is mainly classified into a direct-type backlight and a sidelight-type backlight, depending on a position where the light source is disposed, and these backlights are used properly according to their usage. Between these backlights, the sidelight-type backlight has a light source disposed on a side surface to be an incident surface of a light guide plate. As the light source of the sidelight-type backlight, for example, a plurality of light emitting diodes to be disposed on an incident side surface of a light guide plate at predetermined intervals have been known (see, for example, JP-A 2000-258749 (KOKAI)).

However, the light source using the light emitting diode chips as described above, because a size of each of the light emitting diode chips being an excitation light source is 1 mm$^2$ or less, almost becomes a point light source even though a phosphor layer is formed on the light emitting diode chips. Thus, in the case when the light source using the light emitting diode chips as described above are used as a light source for illumination, a backlight and the like, it is necessary to provide a lens-shaped transparent resin layer, a diffusion sheet or the like to diffuse light to be emitted.

Even in the case when such a lens-shaped transparent resin layer, diffusion sheet or the like is provided, it is not always possible to sufficiently reduce a difference in luminance between a portion having the light emitting diode chip provided thereon and a portion sandwiched between the portions having the light emitting diode chips each provided thereon, and a process of providing such a lens-shaped transparent resin layer, diffusion sheet, or the like is needed, resulting that manufacturability is also reduced. Further, in the case when the light source using the light emitting diode chips as described above are used as a light source for illumination, a backlight and the like in place of a conventional cold cathode fluorescent lamp, a shape thereof differs from that of the cold cathode fluorescent lamp, resulting that a new optical design is required with regard to illumination and a backlight.

DETAILED DESCRIPTION

In one embodiment, a linear white light source includes a base, a plurality of light emitting diode chips linearly disposed on the base and each generating ultraviolet light having a wavelength of not less than 330 nm nor more than 410 nm, and a phosphor layer continuously formed on the base to cover the plurality of light emitting diode chips and including a red light emitting phosphor, a green light emitting phosphor, and a blue light emitting phosphor.

In one embodiment, a backlight includes the linear white light source of the embodiment. A liquid crystal display device includes the backlight of the embodiment.

Figure 1:
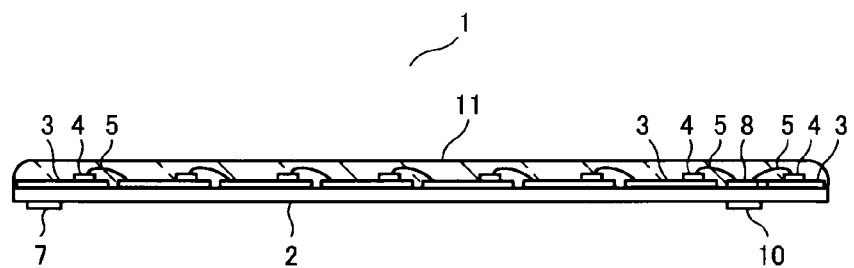
FIG. 1 is a cross-sectional view showing a linear white light source according to an embodiment.
Figure 2:
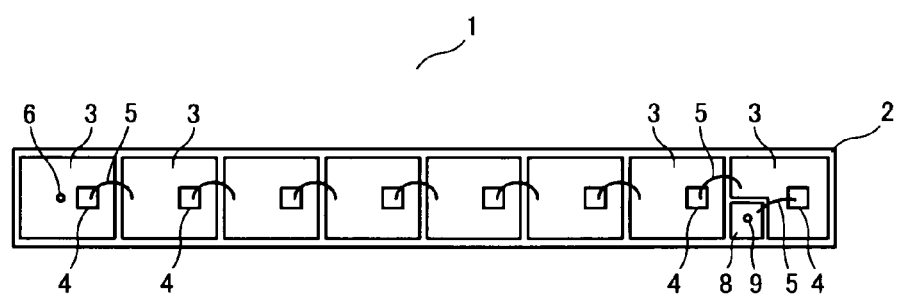
FIG. 2 is a plan view of the linear white light source shown in FIG. 1.
Figure 3:
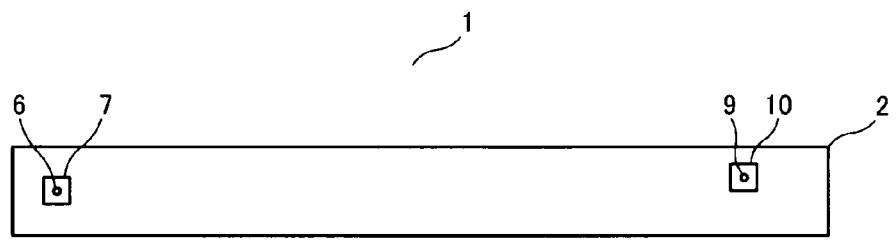
FIG. 3 is a plan view of a rear surface side of the linear white light source shown in FIG. 1.
Figure 4:
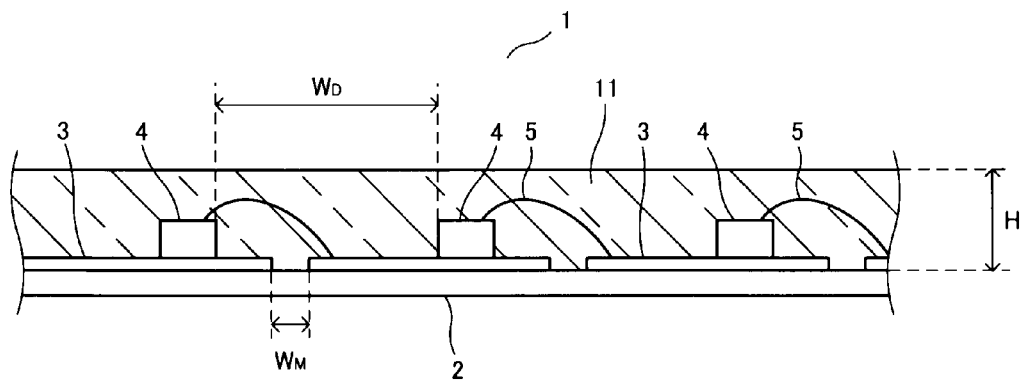
FIG. 4 is a partial enlarged cross-sectional view of the linear white light source shown in FIG. 1.

A linear white light source of the embodiment will be explained. FIG. 1 is a cross-sectional view showing a linear white light source 1 of the embodiment, FIG. 2 is a plan view showing a light emitting surface side of the linear white light source 1 shown in FIG. 1, and FIG. 3 is a plan view showing a non-light emitting surface side (rear surface side) of the linear white light source 1 shown in FIG. 1. Note that FIG. 2 is shown in a manner to omit a phosphor layer so that a state of an inside of the linear white light source 1 is seen. FIG. 4 is a partial enlarged cross-sectional view of the linear white light source 1 shown in FIG. 1.

The linear white light source 1 has a rectangular-shaped base 2 as shown in, for example, FIGS. 1, 2, and on the above base 2, a plurality of, for example, substantially square-shaped metal patterns 3 are formed along a longitudinal direction of the base 2. Further, on each of the metal patterns 3, a light emitting diode chip 4 generating ultraviolet light having a wavelength of not less than 330 nm nor more than 410 nm, (which will be simply called a light emitting diode chip 4, hereinafter), is mounted.

A lower electrode of each of the light emitting diode chips 4 is electrically connected to the metal pattern 3 where the light emitting diode chip 4 is to be mounted. Further, an upper electrode of each of the light emitting diode chips 4 is electrically connected to the metal pattern 3 adjacent to the metal pattern 3 where the light emitting diode chip 4 is to be mounted, (which is the metal pattern 3 to the right side of the metal pattern 3 where each of the light emitting diode chips 4 is to be mounted in FIGS. 1, 2), by a conductive wire 5.

Incidentally, the metal pattern 3 to be formed on one end portion side (the left side in FIGS. 1, 2) of the base 2 is electrically connected to an electrode pad 7 formed on the rear surface side of the base 2 as shown in FIG. 3 via a via conductor 6 passing through the base 2 in a front-rear direction as shown in FIG. 2, for example.

On the other hand, the metal pattern 3 on the other end portion side (right side in FIGS. 1, 2) of the base 2 is set to have a shape in which a part of the substantially square-shape is lacked as shown in, for example, FIG. 2, and has a substantially square-shaped electrode pad 8 formed on a lacking part of the metal pattern 3. Then, the conductive wire 5 from the upper electrode of the light emitting diode chip 4 mounted on the metal pattern 3 is connected to the above electrode pad 8. Further, the electrode pad 8 is electrically connected to an electrode pad 10 formed on the rear surface side of the base 2 as shown in FIG. 3 via a via conductor 9 passing through the base 2 in the front-rear direction.

Further, on a side of the base 2, where the metal patterns 3 and the light emitting diode chips 4 are mounted as shown in FIG. 1, a phosphor layer 11 is continuously formed to cover almost all of the metal patterns 3 and light emitting diode chips 4. That is, the phosphor layer 11 is shared by the plurality of light emitting diode chips 4. The above phosphor layer 11 is one in which a red light emitting phosphor, a green light emitting phosphor, and a blue light emitting phosphor are contained in a transparent resin.

Since in the linear white light source 1 as above, the plurality of light emitting diode chips 4 disposed linearly are electrically connected via each of the metal patterns 3 and conductive wires 5, the electrode pad 7 and the electrode pad 10 that are formed on the rear surface side of the base 2 are connected to a power supply, thereby enabling ultraviolet light having a wavelength of not less than 330 nm nor more than 410 nm to be generated from each of the light emitting diode chips 4.

Further, since the red light emitting phosphor, the green light emitting phosphor, and the blue light emitting phosphor are contained in the phosphor layer 11, the phosphor layer 11 is excited by the ultraviolet lights each having a wavelength of not less than 330 nm nor more than 410 nm generated from the light emitting diode chips 4 to thereby emit red light, green light, and blue light, resulting that by mixing these colors, white light can be obtained from the entire linear white light source 1.

The linear white light source 1 has the plurality of light emitting diode chips 4 disposed linearly in particular, and has the phosphor layer 11 provided continuously to cover all of the plurality of light emitting diode chips 4, and thereby it is possible to easily suppress luminance unevenness on the light emitting surface and to improve manufacturability of the linear white light source 1. Further, the linear white light source 1 as above has a similarity in its shape and the like to those of a conventional cold cathode fluorescent lamp or the like, so that the linear white light source 1 can be suitably used without newly optical designing illumination, a backlight, and so on that use a conventional cold cathode fluorescent lamp or the like.

The base 2 in the linear white light source 1 as above is made of, for example, an aluminum oxide sintered body, an aluminum nitride sintered body, a mullite sintered body, ceramic such as glass-ceramic, or a glass insulator such as silica. The base 2 preferably has a thermal expansion coefficient that is substantially the same as that of each of the light emitting diode chips 4. Further, from the viewpoint of thermal conductivity, the base 2 is more preferably made of an aluminum nitride sintered body. If it is made of an aluminum nitride sintered body, a sintered body having a thermal conductivity of 200 W/m·K or more can be provided.

The metal patterns 3 are each used for supplying power to each of the light emitting diode chips 4 and each have a role as a reflection layer. A planar shape of each of the metal patterns 3 is not limited in particular, but an area thereof is preferably large from the viewpoint of making the metal pattern 3 function as a reflection layer, and the substantially square-shape as shown in FIG. 2, for example, is desirable because a large area can be secured.

As for the metal patterns 3 as above, from the viewpoints of increasing areas functioning as the reflection layer and facilitating the connections by the conductive wires 5, an interval ($W_M$) between the metal patterns 3 adjacent to each other as shown in FIG. 4 is preferably narrowed as much as possible, and is preferably set to 0.2 mm or less, for example. The interval between the metal patterns 3 adjacent to each other can be narrowed down to, for example, 0.03 mm or so.

Incidentally, the number of the metal patterns 3 and positions where the metal patterns 3 are each to be formed are determined as appropriate in accordance with the number of the light emitting diode chips 4, a disposition interval between the light emitting diode chips 4, and so on because the metal patterns 3 have the light emitting diode chips 4 to be mounted thereon.

The metal patterns 3 are each used as a power supply unit to each of the light emitting diode chips 4 and a reflection layer, so that the metal patterns 3 are preferably each made of at least one metal selected from, for example, Au, Al, Ag, Pt, Ti, and Ni. Incidentally, the metal patterns 3 are not always necessary to be a single layer, and from the viewpoint of improving adhesiveness to the base 2, for example, it may also be set in a manner that a Ti layer is first provided on the base 2, and on the Ti layer, layers made of Au, Al, Ag, Pt, and so on are provided. Further, it is more preferable if a gold pad is provided on, out of a front surface portion of each of the metal patterns 3, a position that has each of the light emitting diode chips 4 provided thereon and is connected to the lower electrode of the light emitting diode chip 4.

Further, it is also possible to set the electrode pad 8 that is formed on the light emitting surface side of the base 2 and the electrode pads 7 and 10 that are formed on the rear surface side as shown in FIG. 3 made of a metallic material that is substantially the same as that of the metal patterns 3.

The light emitting diode chips 4 to be used for the embodiment each generate ultraviolet light having a wavelength of not less than 330 nm nor more than 410 nm. As long as each of the light emitting diode chips 4 is one capable of generating ultraviolet light having a wavelength as described above, a type of the light emitting diode chip 4 is not limited in particular, and a publicly known one such as, for example, an $In_xGa_{1-x}N$ based one can be used.

The light emitting diode chip 4 having an area of a light emitting portion of not less than 0.3 mm$^2$ nor more than 0.6 mm$^2$ is normally used. As long as the plurality of light emitting diode chips 4 as above are disposed substantially linearly on the base 2 in the longitudinal direction, an interval ($W_D$) therebetween is not limited in particular, but from the viewpoint of suppressing an increase in power consumption due to an improvement in a disposition density and the like, the interval ($W_D$) is preferably set to 1 mm or more. Here, the interval ($W_D$) is a distance between end portions facing to each other of the light emitting diode chips 4 adjacent to each other as shown in FIG. 4.

The phosphor layer 11 is provided not only on an upper surface and side surfaces of each of the light emitting diode chips 4 but also on interval portions each between the light emitting diode chips 4 adjacent to each other, and thereby it becomes possible to reduce a difference in luminance between the portion where the light emitting diode chip 4 is disposed and the interval portion therebetween and to suppress the luminance unevenness even in the case when the light emitting diode chips 4 are provided at the relatively wide intervals ($W_D$) of 1 mm or more as above.

Incidentally, the interval ($W_D$) between the light emitting diode chips 4 adjacent to each other is preferably set to 5 mm or less. The phosphor layer 11 is provided also on the interval portions each between the light emitting diode chips 4 adjacent to each other, thereby enabling the luminance unevenness to be suppressed, but in the case when the interval ($W_D$) exceeds the above-described value, although the phosphor layer 11 is provided on the interval portions, the difference in luminance is increased, resulting that the above case is not desirable.

Further, the number of the light emitting diode chips 4 to be mounted on the base 2 is preferably 2 or more, but from the viewpoint of using the light emitting diode chips 4 as a light source in place of a conventional cold cathode fluorescent lamp or the like, and the like, certain numbers of the light emitting diode chips 4 to some extent are preferably mounted on the base 2, and, for example, 5 or more of the light emitting diode chips 4 are preferably mounted on the base 2. An upper limit of the number of the light emitting diode chips 4 to be mounted on the base 2 is not necessarily limited, and the number of the light emitting diode chips 4 can be increased as appropriate by changing a size of the base 2, or the like. Note that when handleability of the linear white light source is considered, the number of the chips is preferably 10 or less.

Further, the phosphor layer 11 is the one in which the red light emitting phosphor, the green light emitting phosphor, and the blue light emitting phosphor are contained in the transparent resin. The phosphor layer 11 preferably has a height (H) from the front surface of the base 2 to a front surface of the above phosphor layer 11 set to 0.5 mm or more at least at the portions where the light emitting diode chips 4 are each disposed. When the height (H) of the phosphor layer 11 is less than the above-described height, a fear that sufficient white light cannot be obtained is caused, which is not desirable. Further, when the height (H) of the phosphor layer 11 is increased excessively, a fear that the luminance is reduced is caused and further the manufacturability is also reduced, so that the height (H) is preferably set to 2 mm or less.

As the transparent resin constituting the phosphor layer 11, for example, an acrylic resin, an epoxy resin, a silicone resin, a polyimide resin, or the like is used.

Among the respective color phosphors constituting the phosphor layer 11, for the red light emitting phosphor, a red phosphor powder emitting red light having a peak wavelength of not less than 620 nm nor more than 780 nm is used. At least one selected from a red phosphor powder made of europium-activated lanthanum oxysulfide with a composition expressed by the following formula (1) and a red phosphor powder with a composition expressed by the following formula (2) is used.

$$(La_{1-x-y}Eu_xM_y)_2O_2S \qquad (1)$$

where, M is at least one element selected from Sb, Sm, Ga, and Sn, and x and y are values satisfying $0.01<x<0.15$ and $0 \leq y<0.03$.

In the formula (1), when M is at least one element selected from Sb, Sm, Ga, and Sn, light emission efficiency of the red phosphor powder is high, so that it is desirable.

$$(Sr_xCa_{1-x})SiAlN_3:Eu \qquad (2)$$

where, x is a value satisfying $0 \leq x<0.4$.

In the formula (2), when x falls within the above-described range, a wavelength region of light from the red phosphor powder becomes appropriate, and light emission efficiency is high and the wavelength region and the light emission efficiency are well-balanced, so that it is desirable. As x becomes larger in the above-described range, a wavelength of the light from the red phosphor powder easily shortens, and as x becomes smaller in the above-described range, the light emission efficiency of the red phosphor powder increases.

For the green light emitting phosphor, a green phosphor powder emitting green light having a peak wavelength of 490 nm to 575 nm is used. At least one selected from a green phosphor powder made of europium/manganese-activated aluminate with a composition expressed by the following formula (3) and a green phosphor powder with a composition expressed by the following formula (4) is used.

$$(Ba_{1-x-y-z}Sr_xCa_yEu_z)(Mg_{1-u}Mn_u)Al_{10}O_{17} \qquad (3)$$

where, x, y, z, and u are values satisfying $0 \leq x<0.2$, $0 \leq y<0.1$, $0.005<z<0.5$, and $0.1<u<0.5$.

In the formula (3), when z and u fall within the above-described ranges respectively, light emission efficiency of the green phosphor powder is high, so that it is desirable. When x and y fall within the above-described ranges respectively, a life and luminance of the green phosphor powder are well-balanced, so that it is desirable. When x is 0.2 or more, a fear that the life of the green phosphor powder reduces is caused, and when x is zero, a short wavelength component of the light from the green phosphor powder increases to cause a fear that the luminance reduces.

$$(Sr_{2-x-y-z-u}Ba_xMg_yEu_zMn_u)SiO_4 \qquad (4)$$

where, x, y, z, and u are values satisfying 0.1<x<0.4, 0.005<y<0.21, 0.05<z<0.3, and 0.001<u<0.04.

In the formula (4), when x falls within the above-described range, a wavelength of light from the green phosphor powder becomes suitable for a backlight, so that it is desirable. As x becomes larger in the above-described range, the wavelength of the light from the green phosphor powder shortens to become more suitable for a backlight. Further, when y falls within the above-described range, solid-dissolving of Mn is sufficiently performed in the green phosphor powder, so that it is desirable. Further, when z falls within the above-described range, light emission efficiency of the green phosphor powder is high, so that it is desirable. Further, when u falls within the above-described range, the wavelength of the light from the green phosphor powder becomes suitable for a backlight, so that it is desirable.

For the blue light emitting phosphor, a blue phosphor powder emitting blue light having a peak wavelength of 430 nm to 460 nm is used. For example, a blue phosphor powder with a composition expressed by the following formula (5) is used.

$(Sr_{1-x-y-z}Ba_xCa_yEu_z)_5(PO_4)_3Cl$ (5)

where, x, y, and z are values satisfying $0 \leq x < 0.5$, $0 \leq y < 0.1$, and $0.005 < z < 0.1$.

In the formula (5), when x and y fall within the above-described ranges respectively, a wavelength of light from the blue phosphor powder becomes suitable for a white light source as a use of a backlight, so that it is desirable. As x and y become smaller in the above-described ranges respectively, a spectral width of the light from the blue phosphor powder narrows, so that the white light source becomes more suitable for a use as a backlight. Further, when z falls within the above-described range, light emission efficiency of the blue phosphor powder is high, so that it is desirable.

Even if, besides the above-described phosphors, as the red light emitting phosphor, for example, an Eu-activated yttrium oxysulfide phosphor or a Cu and Mn-activated zinc sulfide phosphor, as the green light emitting phosphor, for example, a Cu and Al-activated zinc sulfide phosphor, and as the blue light emitting phosphor, for example, an Eu-activated aluminate phosphor, Eu-activated alkaline earth silicate, Eu and Mn-activated alkaline earth magnesium silicate, or the like are used, good color reproducibility and luminance characteristics are exhibited as a white light source.

A content of the phosphors in the phosphor layer 11 is preferably 20 to 70 mass. When the content is less than 20 mass %, a fear that a phosphor amount becomes insufficient is caused, and on the other hand, when the content exceeds 70 mass %, a fear that it becomes difficult to uniformly mix the respective color phosphors is caused. Further, when the content of the phosphors exceeds 90 mass %, a fear that the lights from the light emitting diode chips are not uniformly transmitted in the phosphor layer is caused. Further, the phosphor amount is adjusted, thereby enabling the luminance unevenness to be improved to 50% or more.

According to the linear white light source 1 as above, the luminance unevenness can be suppressed while improving the luminance. The luminance unevenness can be suppressed to 1% or more while setting the efficiency on the light emitting surface to 20 lm/W or more.

Here, the luminance unevenness is a ratio of a minimum value of the luminance to a maximum value of the luminance on the light emitting surface of the linear white light source 1 (=(minimum value of luminance/maximum value of luminance)×100[%]). Thus, as a value of the above luminance unevenness gets closer to 100%, a difference in luminance in each portion on the light emitting surface of the linear white light source 1 is reduced, resulting that the luminance unevenness is suppressed. Incidentally, the luminance is measured in the portion where each of the light emitting diode chips 4 is mounted and in each of intermediate portions between the light emitting diode chips 4 adjacent to each other, and in the measurement, the lowest luminance is set to a minimum value of the luminance and the highest luminance is set to a maximum value of the luminance.

Figure 5:
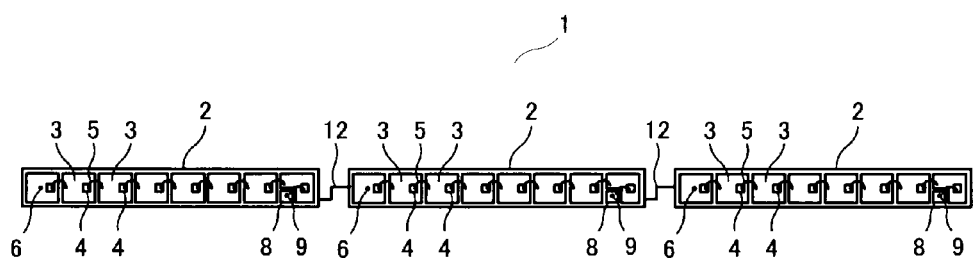
FIG. 5 is a plan view showing a linear white light source according to another embodiment.

The linear white light source 1 of the embodiment has been explained, but the linear white light source 1 is not necessarily limited to the one shown in FIG. 1 and the like, and it may also be set in a manner that, for example, the one shown in FIG. 1 is set to one unit and three units are linearly disposed as shown in FIG. 5. In the above case, the units adjacent to each other have the electrode pad 10 of one unit and the electrode pad 7 of the other unit portion adjacent thereto connected by a various electrical connection unit 12. Note that FIG. 5 shows an example where three units are connected, but the number of units to be connected is not necessarily limited to the number of units as above.

Figure 6:
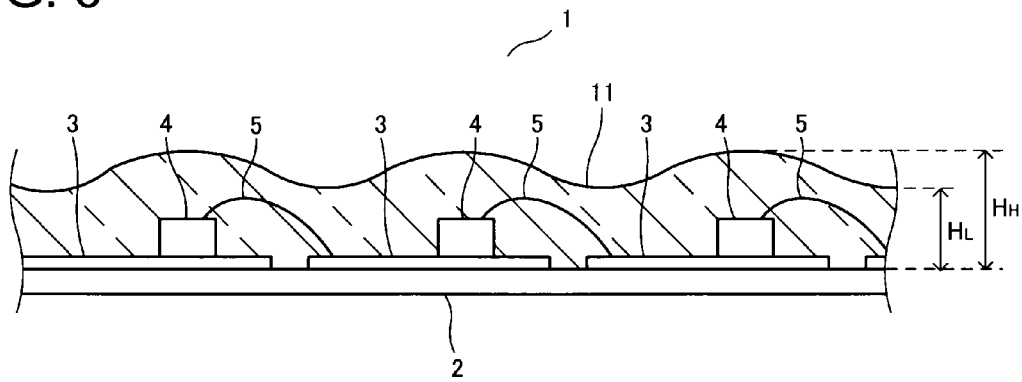
FIG. 6 is a partial enlarged cross-sectional view showing a linear white light source according to another embodiment.

Further, the linear white light source 1 of the embodiment may also be set in a manner that, as shown in, for example, FIG. 4, besides the one in which the front surface of the phosphor layer 11 is flat, as shown in FIG. 6, for example, the phosphor layer 11 in the portions having the light emitting diode chips 4 each mounted thereon is formed in shapes of convex portions to have a high height, and the phosphor layer 11 in the interval portions each between the light emitting diode chips 4 adjacent to each other is formed in shapes of concave portions to have a low height. In this manner, the linear white light source 1 excellent in, for example, light-taking-out efficiency can be set.

In the above case, a ratio of a height from the front surface of the base 2 to a front surface of the concave portion of the phosphor layer 11 (concave portion height ($H_L$)) to a height from the front surface of the base 2 to a front surface of the convex portion of the phosphor layer 11 (convex portion height ($H_H$)) (=concave portion height ($H_L$)/convex portion height ($H_H$))×100[%]) is preferably 50% or more. When the ratio of the heights is less than the above-described value, the height of the phosphor layer 11 in the interval portions each between the light emitting diode chips 4 adjacent to each other is too low to cause a fear that an effect of suppressing the luminance unevenness become insufficient, which is not desirable. Note that the convex portion height ($H_H$) is preferably set to not less than 1 mm nor more than 2 mm.

Next, a method of manufacturing the linear white light source 1 of the embodiment will be explained. First, the plurality of, for example, substantially square-shaped metal patterns 3 are formed on the base 2. A method of forming the metal patterns 3 on the base 2 is not limited in particular, and the metal patterns 3 can be formed by using a publicly known metallization method. Incidentally, the planar shape of each of the metal patterns 3, the number of the metal patterns 3 to be formed, and so on are determined as appropriate in accordance with the number of the light emitting diode chips 4 to be mounted.

Further, each of the light emitting diode chips 4 is joined and mounted on each of the metal patterns 3 with well-known eutectic metal such as Au, Pb/Sn, Au/Sn, Au/Ge, Au/Sn/Ge, Au/Pb/Sn, or Cu/Pb/Sn, and then the upper electrode of each of the light emitting diode chips 4 and the metal pattern 3 adjacent to the metal pattern 3 having the light emitting diode chip 4 mounted thereon are connected by the conductive wire 5.

Thereafter, the phosphor layer 11 is formed on the above base 2 where the metal patterns 3 and the light emitting diode chips 4 are mounted. That is, first, as a resin composition to be used for forming the phosphor layer 11, (which will be simply called a resin composition, hereinafter), one in which the red light emitting phosphor, the green light emitting phosphor, and the blue light emitting phosphor are mixed and dispersed in a transparent resin such as an acrylic resin, an epoxy resin, a silicone resin, or a polyimide resin is prepared.

Then, the above resin composition is injected into, for example, a dispenser, and the dispenser is moved while discharging the resin composition toward one end portion side of the base 2 having the metal patterns 3 and the light emitting diode chips 4 mounted thereon to the other end portion side thereof from the dispenser, and thereby the resin composition is coated, and then the resin composition is cured to continuously form the phosphor layer 11.

Figure 7:
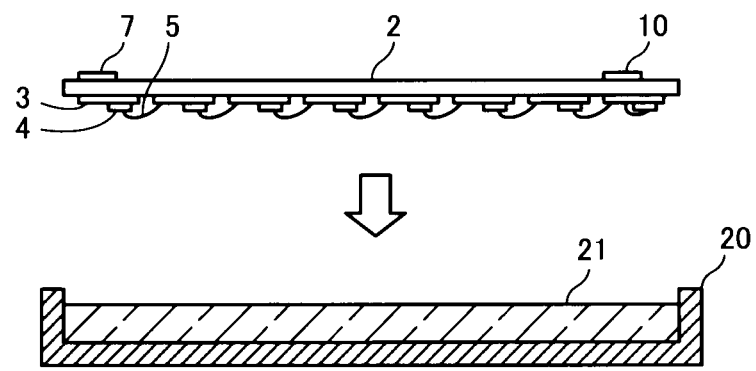
FIG. 7 is a cross-sectional view showing an example of manufacturing the linear white light source according to the embodiment.

On the other hand, as another method of forming the phosphor layer 11, as shown in, for example, FIG. 7, a resin composition 21 as described above is filled into a form 20 and the base 2 having the metal patterns 3 and the light emitting diode chips 4 mounted thereon is put in the form 20 while facing a side where the metal patterns 3 and the light emitting diode chips 4 are mounted toward a form 20 side, and in the above state, the resin composition 21 is cured, and thereby it is also possible to continuously form the phosphor layer 11.

Figure 8:
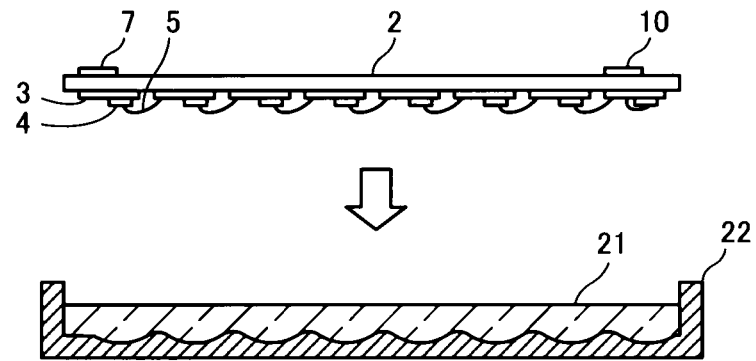
FIG. 8 is a cross-sectional view showing another example of manufacturing the linear white light source according to the embodiment.

Further, in the case when the phosphor layer 11 having the concave and convex front surface as shown in FIG. 6 is formed, a form 22 having concave and convex portions at an inner bottom portion as shown in FIG. 8 is used and the resin composition 21 as described above is filled into an inside thereof, and the base 2 having the metal patterns 3 and the light emitting diode chips 4 mounted thereon is put in the form 22 while facing the side where the metal patterns 3 and the light emitting diode chips 4 are mounted toward a form 22 side, and in the above state, the resin composition 21 is cured.

Here, the inner bottom portion of the form 22 has the portions facing to the light emitting diode chips 4 set to the concave portions, so that as shown in FIG. 6, in the linear white light source 1 to be obtained finally, the phosphor layer 11 in the portions having the light emitting diode chips 4 each mounted thereon is formed in convex shapes and the phosphor layer 11 in the interval portions each between the light emitting diode chips 4 adjacent to each other is formed in concave shapes.

The linear white light source 1 is suitably used for a light source for a backlight. Particularly, a light emitting device 1 of the embodiment is linear and has a similarity in its shape to that of a conventional cold cathode fluorescent lamp or the like, so that the light emitting device 1 can be suitably used without newly optical designing illumination, a backlight, and so on that use a conventional cold cathode fluorescent lamp or the like.

Figure 9:
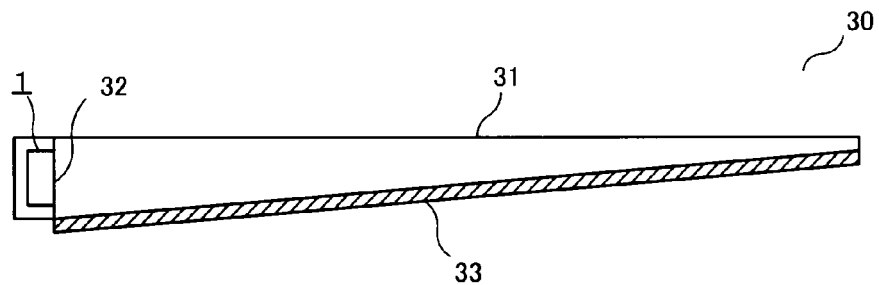
FIG. 9 is a cross-sectional view showing a backlight according to an embodiment.

FIG. 9 shows a sidelight-type backlight 30 of the embodiment. The sidelight-type backlight 30 is mainly composed of the linear white light source 1 and a light guide plate 31. The light guide plate 31 is formed in a substantially plate shape whose thickness gradually reduces from a side of an incident surface 32 being one side surface to the other side surface, and the linear white light source 1 is disposed on the above incident surface 32. Further, a reflection layer 33 is provided on a side opposite to a light emitting surface of the light guide plate 31.

Figure 10:
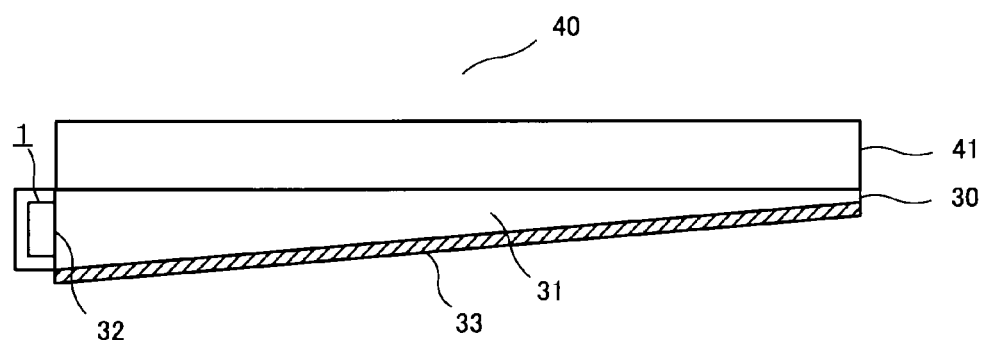
FIG. 10 is a cross-sectional view showing a liquid crystal display device according to an embodiment.

A liquid crystal display device of the embodiment is manufactured by using the backlight as above. FIG. 10 shows a liquid crystal display device 40 of the embodiment, and the sidelight-type backlight 30 as described above is used for a light source of the liquid crystal display device 40. Although the linear white light source uses the light emitting diode chips, the linear light source in which the luminance unevenness is improved can be provided, and thus even if the linear white light source is applied to the sidelight-type backlight, a light guide plate that has been used in a CCFL can be applied as it is, resulting that it is not necessary to perform a design change of the light guide plate.

The liquid crystal display device 40 is composed of a flat-shaped liquid crystal panel 41 as, for example, a display unit and the sidelight-type backlight 30 illuminating the above liquid crystal panel 41 from the back. The liquid crystal panel 40 is formed in a manner that an array substrate and a color filter substrate each having a transparent electrode formed thereon and being a glass plate are disposed in a manner to face to each other between, for example, two polarizing plates and liquid crystal is injected between the array substrate and the color filter substrate, thereby structuring a liquid crystal layer. Red (R), green (G), and blue (B) color filters corresponding to each pixel are formed on the color filter substrate.

EXAMPLES

Examples 1 to 10

The bases 2 (aluminum nitride sintered bodies each having a thermal conductivity of 200 W/m·K) each having a size of 18 mm in length×2 mm in width×0.635 mm in thickness were used, and on the front surface of each of the bases 2, the plurality of substantially square-shaped metal patterns 3 composed of respective layers made of Ti/Pt/Au in order were formed. Incidentally, it was set in a manner that the number of the metal patterns 3 to be formed agrees with the number of the later-described light emitting diode chips 4 to be mounted, and the interval ($W_M$) between the metal patterns 3 adjacent to each other is 0.1 mm. Further, the electrode pad 7 and the electrode pad 10 were formed on the rear surface side of each of the bases 2.

Further, each of the light emitting diode chips 4 emitting ultraviolet light having an excitation wavelength of 390 nm was joined on each of the metal patterns 3, and the lower electrode of the above light emitting diode chip 4 and the metal pattern 3 were electrically connected. Further, the upper electrode of each of the light emitting diode chips 4 and the metal pattern 3 adjacent to the metal pattern 3 having the above light emitting diode chip 4 mounted thereon were electrically connected by the conductive wire 5.

Incidentally, it was set in a manner that the size of each of the light emitting diode chips 4 is 0.4 mm in length×0.4 mm in width×0.2 mm in height, and a height from the front surface of the base 2 to the upper surface of the light emitting diode chip 4 is 0.2 mm, and the number of the light emitting diode chips 4 to be mounted and the interval ($W_D$) between the light emitting diode chips 4 adjacent to each other were as described in Table 1.

Then, the phosphor layer 11 was formed on each of the bases 2 on which the above light emitting diode chips 4 are mounted. That is, as a blue phosphor, europium-activated alkaline earth chlorophosphate $(Sr_{0.99}Eu_{0.01})_{10}(PO_4)_6.Cl_2$, as a green phosphor, an europium and manganese-activated aluminate phosphor $(Ba_{0.726}Eu_{0.274})(Mg_{0.55}Mn_{0.45})Al_{10}O_{17}$, and as a red phosphor, europium-activated lanthanum oxysulfide $(La_{0.883}Sb_{0.002}Eu_{0.115})_2O_2S$ were each mixed in a silicone resin in a concentration of 30 mass, and slurries were obtained. Then, these slurries were mixed at a ratio of 20.1 mass %, 19.5 mass %, and 60.4 mass % to be the resin composition for forming a phosphor layer.

Then, the form 20 having the flat inner bottom portion as shown in FIG. 7 and the form 22 having the concave and convex portions at the inner bottom portion as shown in FIG. 8 were used, and the above-described resin composition 21 for forming a phosphor layer was filled into the insides. Further, the base 2 having the light emitting diode chips 4 mounted thereon was put in the above form 20 and form 22 while facing the side where the light emitting diode chips 4 and the like are mounted toward the form 20 side and form 22 side.

Then, the above resin compositions 21 for forming a phosphor layer were cured, the phosphor layer 11 was formed on each of the bases 2 having the light emitting diode chips 4 and the like mounted thereon, and the linear white light sources 1 each having the phosphor layer 11 whose front surface is flat as shown in FIG. 4 and the linear white light sources 1 each in which the concave and convex portions are formed on the front surface of the phosphor layer 11 as shown in FIG. 6 were manufactured.

Incidentally, the height (H) from the front surface of the base 2 to the front surface of the phosphor layer 11 in the case of the front surface of the phosphor layer 11 being flat, and in the case of the front surface of the phosphor layer 11 being concave and convex, the height ($H_H$) from the front surface of the base 2 to the front surface of the convex portion of the phosphor layer 11 and the height ($H_L$) from the front surface of the base 2 to the front surface of the concave portion of the phosphor layer 11 are as described in Table 1.

Example 11

A linear white light source was manufactured by a method similar to that of Example 1 except that the type and content of the phosphors to be used are changed. That is, as the red phosphor, $(Sr_{0.01}Ca_{0.99})SiAlN_3$:Eu, as the green phosphor, $(Sr_{1.58}Ba_{0.11}Mg_{0.2}Eu_{0.1}Mn_{0.01})SiO_4$, and as the blue phosphor, $(Sr_{0.85}Ba_{0.01}Ca_{0.09}Eu_{0.05})_{10}(PO_4)_3Cl$ were each mixed in a silicone resin in a concentration of 30 mass, and slurries were obtained. Then, these slurries were mixed at a ratio of 30 mass, 40 mass %, and 30 mass % to be a resin composition for forming a phosphor layer.

Comparative Example 1

Figure 11:
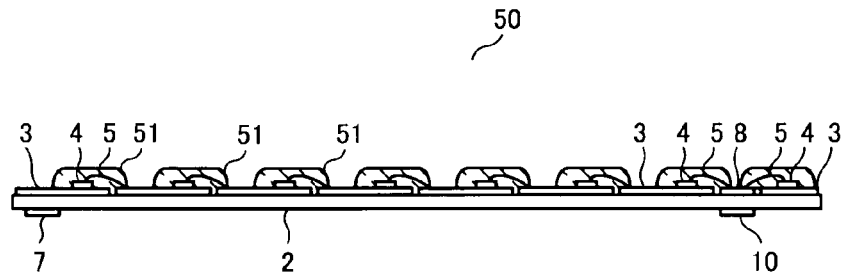
FIG. 11 is a cross-sectional view showing a linear white light source manufactured as Comparative Example.

Similarly to Example 1, the light emitting diode chips 4 were mounted and the conductive wires 5 were formed. Then, a resin composition for forming a phosphor layer similar to that used in Examples 1 to 10 was injected into a dispenser, and the resin composition for forming a phosphor layer was discharged from the above dispenser to form phosphor layers 51 only on peripheral portions of the light emitting diode chips 4 as shown in FIG. 11, and thereby a linear white light source 50 was obtained.

Incidentally, a range (in a plane direction) where each of the phosphor layers 51 is formed in Comparative Example 1 was set to a range from end portions of each of the light emitting diode chips 4 to 0.6 mm, and a height from the front surface of the base 2 to a front surface of the phosphor layer 50 was set to 1.2 mm. Further, in FIG. 11, the same reference numerals as those of Examples are added to portions showing the same portions as those of Examples.

Next, in the linear white light sources 1 in Examples and the linear white light source 50 in Comparative Example, the luminance and the luminance unevenness were measured. The measurement of the luminance was performed in each of the portions having the light emitting diode chips 4 each mounted thereon by using a luminance meter, and a maximum value was set from the measured luminances. Further, as for the luminance unevenness, the luminance of each of the portions having the light emitting diode chips 4 each mounted thereon and the luminance of each of the intermediate portions each between the light emitting diode chips 4 adjacent to each other were measured, and the luminance unevenness was calculated by the following expression from a maximum value and a minimum value of the above luminances. Results are shown in Table 1.

Luminance unevenness=(minimum value of luminance/maximum value of luminance)×100[%]

TABLE 1

| | LED CHIP | | PHOSPHOR LAYER | | LUMINANCE UNEVENNESS (%) | EFFICIENCY (lm/W) |
|---|---|---|---|---|---|---|
| | NUMBER (PIECE) | INTERVAL WD (mm) | FRONT SURFACE SHAPE | HEIGHT (mm) | | |
| EXAMPLE 1 | 8 | 2 | FLAT | 1.2*[1] | 97 | 50 |
| EXAMPLE 2 | 8 | 5 | FLAT | 0.5*[1] | 85 | 50 |
| EXAMPLE 3 | 8 | 3 | FLAT | 1.0*[1] | 95 | 50 |
| EXAMPLE 4 | 8 | 1 | FLAT | 1.5*[1] | 99 | 50 |
| EXAMPLE 5 | 8 | 0.5 | FLAT | 2.0*[1] | 99 | 50 |
| EXAMPLE 6 | 8 | 1.2 | CONCAVE AND CONVEX | 1.8*[2]  1.5*[3] | 94 | 50 |
| EXAMPLE 7 | 8 | 1.5 | CONCAVE AND CONVEX | 2.0*[2]  1.6*[3] | 95 | 50 |
| EXAMPLE 8 | 8 | 2 | CONCAVE AND CONVEX | 1.5*[2]  1.0*[3] | 95 | 50 |
| EXAMPLE 9 | 10 | 4 | CONCAVE AND CONVEX | 1.3*[2]  0.8*[3] | 86 | 50 |
| EXAMPLE 10 | 5 | 4 | CONCAVE AND CONVEX | 1.0*[2]  0.6*[3] | 84 | 50 |
| EXAMPLE 11 | 8 | 2 | FLAT | 1.2*[1] | 94 | 52 |
| COMPARATIVE EXAMPLE 1 | 8 | 2 | — | — | 0 | 50 |

*[1]HEIGHT (H)
*[2]HEIGHT ($H_H$) IN CONVEX PORTION
*[3]HEIGHT ($H_L$) IN CONCAVE PORTION

As shown in Table 1, according to the linear white light sources 1 in Examples, it was confirmed that the luminance is high and the luminance unevenness is effectively suppressed. In contrast, Comparative Example 1 was a point light source and had portions being luminous and not luminous, so that the luminance unevenness was 0%.

Examples 12 to 22, Comparative Example 2

The sidelight-type backlights 30 in Examples 12 to 22 as shown in FIG. 9 were manufactured by using the linear white light sources 1 in Examples 1 to 11. Note that the sidelight-type backlights 30 were each set for an 8-inch liquid crystal display device. Further, ten of the linear white light sources 10 were each aligned lengthwise to be an 8-inch linear light source. Further, the linear white light source 50 in Comparative Example 1 was used to manufacture a sidelight-type backlight similarly.

Next, the luminance unevenness on the light emitting surface of each of the above sidelight-type backlights 30 was measured. Results thereof are shown in Table 2.

Figure 12:
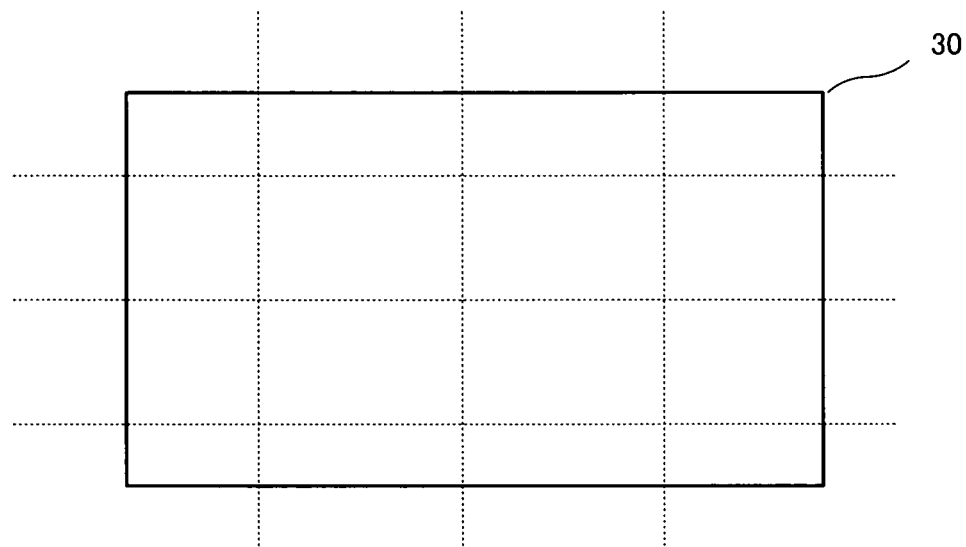
FIG. 12 is a plan view showing a method of measuring luminance of the backlight.

Note that the measurement of the luminance unevenness was performed in the following manner. That is, as shown in FIG. 12, center lines were first drawn on a center portion of the light emitting surface of each of the sidelight-type backlights 30 in a vertical direction and in a horizontal direction, and further equal dividing lines were drawn on both sides of the center lines respectively, and intersection points (nine points) of the vertical lines and the horizontal lines were set to measuring points. Then, the luminance at the intersection point of the center lines in the vertical direction and in the horizontal direction was measured with a luminance meter to set to a center luminance.

Then, each of the luminance at the remaining eight points was measured with a luminance meter to be compared with the center luminance, and the luminance with the largest difference was used to calculate the luminance unevenness by the following expression. Incidentally, as the luminance unevenness gets closer to 100%, the difference in luminance in each portion on the light emitting surface is reduced, so that it becomes desirable.

Luminance unevenness=(luminance with the largest difference as compared with center luminance/center luminance)×100[%]

TABLE 2

| | BACKLIGHT | |
|---|---|---|
| | LINEAR WHITE LIGHT SOURCE | LUMINANCE UNEVENNESS (%) |
| EXAMPLE 12 | EXAMPLE 1 | 84 |
| EXAMPLE 13 | EXAMPLE 2 | 66 |
| EXAMPLE 14 | EXAMPLE 3 | 76 |
| EXAMPLE 15 | EXAMPLE 4 | 88 |
| EXAMPLE 16 | EXAMPLE 5 | 89 |
| EXAMPLE 17 | EXAMPLE 6 | 74 |
| EXAMPLE 18 | EXAMPLE 7 | 75 |
| EXAMPLE 19 | EXAMPLE 8 | 77 |
| EXAMPLE 20 | EXAMPLE 9 | 66 |
| EXAMPLE 21 | EXAMPLE 10 | 65 |
| EXAMPLE 22 | EXAMPLE 11 | 81 |
| COMPARATIVE EXAMPLE 2 | COMPARATIVE EXAMPLE 1 | 38 |

As shown in Table 2, according to the sidelight-type backlights 30 each using the linear white light source 1 in Examples, it is confirmed that the center luminance is high and the luminance unevenness on the light emitting surface is also suppressed effectively. Each of the linear light sources according to Examples is a linear light source, so that a conventional CCFL can be replaced with the linear light source without changing a design of a light guide plate of the CCFL. In contrast, the sidelight-type backlight in Comparative Example has the inferior luminance unevenness, and a design of a light guide plate is required to be changed if Comparative Example is applied to a sidelight-type backlight.

What is claimed is:

1. A linear white light source comprising:
   a base having a flat surface;
   a plurality of light emitting diode chips linearly disposed on the flat surface of the base and each generating ultraviolet light having a wavelength of not less than 330 nm nor more than 410 nm; and
   a phosphor layer continuously formed on the flat surface of the base to cover the plural light emitting diode chips and including a red light emitting phosphor, a green light emitting phosphor, and a blue light emitting phosphor,
   wherein the plural light emitting diode chips are disposed at an interval of 1 mm or more and 5 mm or less, and
   wherein the phosphor layer has a flat upper surface, and each of heights from the flat surface of the base to the flat upper surface of the phosphor layer in a first portion on which the light emitting diode chip is disposed and a second portion on which the light emitting diode chip is not disposed is in a range of 0.5 to 2 mm.

2. The linear white light source according to claim 1, wherein the number of the light emitting diode chips is equal to or more than five.

3. The linear white light source according to claim 1, wherein luminance unevenness of the linear white light source is not less than 1% nor more than 100%.

4. The linear white light source according to claim 1, wherein the luminance unevenness of the linear white light source is not less than 50% nor more than 100%.

5. The linear white light source according to claim 1, wherein the red light emitting phosphor comprises a phosphor powder with a composition expressed by a general formula (1):

$$(La_{1-x-y}Eu_xM_y)_2O_2S \quad (1)$$

where, M is at least one element selected from Sb, Sm, Ga, and Sn, and x and y are values satisfying $0.01<x<0.15$ and $0 \leq y<0.03$, and/or a phosphor powder with a composition expressed by a general formula (2):

$$(Sr_xCa_{1-x})SiAlN_3:Eu \quad (2)$$

where, x is a value satisfying $0 \leq x<0.4$.

6. The linear white light source according to claim 1, wherein the green light emitting phosphor comprises a phosphor powder with a composition expressed by a general formula (3):

$$(Ba_{1-x-y-z}Sr_xCa_yEu_z)(Mg_{1-u}Mn_u)Al_{10}O_{17} \quad (3)$$

where, x, y, z, and u are values satisfying $0 \leq x<0.2$, $0 \leq y<0.1$, $0.005<z<0.5$, and $0.1<u<0.5$, and/or a phosphor powder with a composition expressed by a general formula (4):

$$(Sr_{2-x-y-z-u}Ba_xMg_yEu_zMn_u)SiO_4 \quad (4)$$

where, x, y, z, and u are values satisfying $0.1<x<0.4$, $0.005<y<0.21$, $0.05<z<0.3$, and $0.001<u<0.04$.

7. The linear white light source according to claim 1, wherein the blue light emitting phosphor comprises a phosphor powder with a composition expressed by a general formula (5):

$$(Sr_{1-x-y-z}Ba_xCa_yEu_z)_5(PO_4)_3Cl \quad (5)$$

where, x, y, and z are values satisfying $0 \leq x<0.5$, $0 \leq y<0.1$, and $0.005<z<0.1$.

8. A backlight comprising the linear white light source according to claim 1.

9. A liquid crystal display device comprising the backlight according to claim 8.

10. The linear white light source according to claim 1,
wherein the phosphor layer comprises a transparent resin layer formed on the base, and the red, green, and blue light emitting phosphors dispersed in the transparent resin layer, and
wherein a total content of the red, green, and blue light emitting phosphors in the phosphor layer is in a range of 20 to 70 mass %.

11. The linear white light source according to claim 1,
wherein the base comprises a ceramic substrate made of an aluminum oxide sintered body, an aluminum nitride sintered body, a mullite sintered body or a glass-ceramic body, and a plurality of metal patterns formed on the ceramic substrate, and
wherein each of the plural light emitting diode chips is mounted on one of the plural metal patterns.

12. The linear white light source according to claim 11,
wherein each of the plural metal patterns has a square-shape substantially, and
wherein an interval between the adjacent metal patterns is in a range of 0.03 to 0.2 mm.

13. The linear white light source according to claim 11,
wherein each of the plural light emitting diode chips includes a lower electrode and an upper electrode, and
wherein the lower electrode is electrically connected to the metal pattern where the light emitting diode chip is mounted, and the upper electrode is electrically connected to the adjacent metal pattern via a conductive wire.

14. The linear white light source according to claim 11,
wherein each of the plural metal patterns is made of at least one metal selected from Au, Al, Ag, Pt, Ti, and Ni.

15. The linear white light source according to claim 11,
wherein each of the plural metal patterns comprises a Ti layer formed on the ceramic substrate, and a metal layer formed on the Ti layer, and the metal layer is made of at least one metal selected from Au, Al, Ag, Pt, and Ni.

* * * * *